(12) United States Patent
Funabashi et al.

(10) Patent No.: US 6,782,022 B2
(45) Date of Patent: Aug. 24, 2004

(54) SEMICONDUCTOR LASER DEVICE HAVING IMPROVED OUTPUT POWER CHARACTERISTICS

(75) Inventors: Masaki Funabashi, Chiyoda-ku (JP); Ryosuke Yatsu, Chiyoda-ku (JP); Akihiko Kasukawa, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/189,481

(22) Filed: Jul. 8, 2002

(65) Prior Publication Data

US 2003/0043878 A1 Mar. 6, 2003

(30) Foreign Application Priority Data

Aug. 10, 2001 (JP) ........................................ 2001-243627
Aug. 28, 2001 (JP) ........................................ 2001-257474

(51) Int. Cl.[7] .............................................. H01S 5/00
(52) U.S. Cl. ........................................... 372/45; 372/46
(58) Field of Search ......................... 372/29.01, 43–54, 372/75, 92, 29.011, 96; 257/115; 438/24

(56) References Cited

U.S. PATENT DOCUMENTS

| | | | | |
|---|---|---|---|---|
| 5,020,072 A | * | 5/1991 | Abe et al. ....................... 372/96 |
| 5,602,866 A | * | 2/1997 | Fukunaga ....................... 372/96 |
| 5,659,562 A | * | 8/1997 | Hisa ............................. 372/96 |
| 5,818,066 A | * | 10/1998 | Duboz .......................... 257/21 |
| 5,821,570 A | * | 10/1998 | Kazmierski et al. ........... 257/97 |
| 5,960,023 A | * | 9/1999 | Takahashi ...................... 372/96 |
| 6,337,868 B1 | * | 1/2002 | Mizutani ....................... 372/27 |
| 6,455,338 B1 | * | 9/2002 | Takagi et al. ................. 438/24 |
| 6,472,691 B2 | * | 10/2002 | Mukaihara et al. .......... 257/115 |
| 6,608,855 B1 | * | 8/2003 | Hwang et al. ................. 372/96 |

* cited by examiner

Primary Examiner—Don Wong
Assistant Examiner—Tuan N. Nguyen
(74) Attorney, Agent, or Firm—Oblon, Spivak, McClelland, Maier & Neustadt, P.C.

(57) ABSTRACT

A semiconductor laser includes a resonant cavity with a cavity length, an active layer structure provided within the resonant cavity and configured to radiate light in an optical gain distribution having a peak wavelength, an embedding layer provided within the resonant cavity and having a refractive index, and a diffraction grating embedded within the embedding layer and having a bandgap wavelength and a refractive index, the diffraction grating configured to select an emission wavelength of the resonant cavity independently of the peak wavelength in the optical gain distribution of the active layer structure. The embedding layer and diffraction grating are configured to provide operational characteristics satisfying the relationship $0 < \lambda e - \lambda g \leq 100$ nm, where $\lambda e$ is the emission wavelength of the resonant cavity $\lambda g$ is the bandgap wavelength of the diffraction grating. In addition, a difference in the refractive index of the diffraction grating and the embedding layer satisfies the relationship $0.29 < n1 - n2$, where n1 is the refractive index of the diffraction grating and n2 is the refractive index of the embedding layer.

31 Claims, 7 Drawing Sheets

SEMICONDUCTOR LASER DEVICE HAVING IMPROVED OUTPUT POWER CHARACTERISTICS

BACKGROUND OF THE INVENTION

1. Field of the Invention

The present invention relates generally to semiconductor laser devices, and more particularly to a distributed feedback (DFB) semiconductor laser device having high optical output power, narrow spectral linewidth, and excellent single-longitudinal mode lasing characteristics, and which is capable of being manufactured at high product yield.

2. Discussion of the Background

With the recent demand for increased bandwidth for data communications, optical networks and the components essential for their operation are being closely studied. To provide a light source for such optical networks, semiconductor laser devices such as the distributed feedback semiconductor laser device have been used. FIG. 8 shows a cross section of an exemplary distributed feedback semiconductor laser 800 (hereinafter, referred to as a DFB laser). As seen in this figure, the DFB laser has an active layer 801 wherein radiative recombination takes place, and a diffraction grating 803 for changing the real part and/or the imaginary part of the refractive index (complex refractive index) periodically, so that only the light having a specific wavelength is fed back for wavelength selectivity. The diffraction grating 803 is comprised of a group of periodically spaced parallel rows of grating material 805 surrounded by a cladding material 807 (typically made of InP material) to form a compound semiconductor layer that periodically differs in refractive index from the surroundings. In a DFB laser having such a diffraction grating 803 in the vicinity of its active layer 801, the lasing wavelength XDFB which is emitted from the DFB laser is determined by the relation:

$$\lambda_{DFB} = 2n_{eff} \Lambda,$$

where $\Lambda$ is the period of the diffraction grating as shown in FIG. 8, and $n_{eff}$ is the effective refractive index of the waveguide. Thus, the period $\Lambda$ of the diffraction grating and the effective refractive index $n_{eff}$ of the waveguide can be adjusted to set the lasing wavelength $\lambda_{DFB}$ independent of the peak wavelength of the optical gain of the active layer.

This setting of the lasing wavelength XDFB independent of the peak wavelength of the optical gain of the active layer allows for essential detuning of the DFB laser device. Detuning is the process of setting the emitted lasing wavelength of a laser to a different value than the peak wavelength of the optical gain of the active layer to provide more stable laser operation over temperature changes. As is known in the art, a moderately large detuning value (that is, a large wavelength difference between the emitted lasing wavelength and the peak wavelength of the optical gain of the active layer) can improve high speed modulation or wide temperature laser performance, while too large a detuning amount degrades performance. The present inventors have recognized that the amount of detuning changes over wide temperature range because temperature dependence on the lasing wavelength is about 0.1 nm/C, while the gain peak wavelength changes at about 0.4 nm/C. Thus, for wide temperature operation, reduction of optical gain especially in the high temperature range should be considered carefully in designing the detuning.

In addition to detuning, the lasing wavelength $\lambda_{DFB}$ may also be set independent of the peak wavelength of the optical gain of the active layer in order to the obtain different characteristics of the semiconductor laser device. For example, when the lasing wavelength of the DFB laser is set at wavelengths shorter than the peak wavelength of the optical gain distribution, the differential gain increases to improve the DFB laser in high-speed modulation characteristics and the like. Where the lasing wavelength of the DFB laser is set approximately equal to the peak wavelength of the optical gain distribution of the active layer, the threshold current of the laser device decreases at room temperature. Still alternatively, setting $\lambda_{DFB}$ at wavelengths longer than the peak wavelength improves operational characteristics of the DFB laser, such as output power and current injection characteristics, at higher temperatures or at a high driving current operation.

The conventional DFB laser such as that disclosed in FIG. 8 can be broadly divided into a refractive index coupled type laser and a gain coupled type laser. In the refractive index coupled DFB laser, the compound semiconductor layer constituting the diffraction grating has a bandgap energy considerably higher than the bandgap energy of the active layer and the bandgap energy of the lasing wavelength. Thus, bandgap wavelength (which is a wavelength conversion of the bandgap energy) of the diffraction grating is typically at least 100 nm shorter than the lasing wavelength and is usually within the range of 1200 nm–1300 nm if the $\lambda_{DFB}$ is approximately 1550 nm. In the gain coupled DFB laser, the bandgap wavelength of the compound semiconductor layer constituting the diffraction grating is longer than the lasing wavelength and is typically about 1650 nm if the $\lambda_{DFB}$ is approximately 1550 nm. FIGS. 9a and 9b show the operational characteristics of an exemplary refractive index coupled laser and gain coupled laser respectively. Each of these figures includes $\lambda e$, $\lambda g$, $\lambda max$, and $\lambda InP$ shown plotted on an abscissa which shows wavelength increasing from left to right in the figures. In this regard, $\lambda e$ is the selected lasing wavelength of the DFB laser 800, $\lambda max$ is the peak wavelength of the optical gain distribution of the active layer 801, $\lambda g$ is the bandgap wavelength of the diffraction grating material 805, and $\lambda InP$ is the bandgap wavelength of the surrounding InP material 807. As seen in FIGS. 9a and 9b, the bandgap wavelength $\lambda InP$ is typically 920 nm and the bandgap wavelength $\lambda g$ is closely related to the absorption loss of the diffraction grating which is shown by the broken curves 903 and 903'. Moreover, the refractive index of a material increases as the bandgap wavelength of the material increases as shown by the arrows 905. Thus, as seen in the figures, the refractive index of the diffraction grating having the bandgap wavelength $\lambda g$ is generally higher than the refractive index of the surrounding Inp layer having the bandgap wavelength $\lambda InP$.

FIG. 9a shows an exemplary refractive index coupled DFB laser wherein the DFB laser has a lasing wavelength $\lambda e$ of 1550 nm and bandgap wavelength $\lambda g$ of 1250 nm, and satisfies the relationship:

$$\lambda g < \lambda e.$$

Thus, the DFB laser of FIG. 9(a) reflects $\lambda e - \lambda g = 300$ nm. The DFB lasing wavelength $\lambda e$ is usually set within the several tens of nanometer range from the peak wavelength $\lambda max$ of the optical gain distribution of the active layer. In the FIG. 9(a), $\lambda e$ is located longer than $\lambda max$. With the refractive index coupled DFB laser, the absorption loss curve 903 does not cross the lasing wavelength $\lambda e$ and therefore absorption loss at $\lambda e$ is very small. Accordingly, the DFB laser of FIG. 9a, has the advantage of a low threshold current and favorable optical output-injection current characteristics. However, as also shown in FIG. 9a, in a refractive index coupled DFB laser, the absorption loss curve 903 also does not cross the peak wavelength of the optical gain distribution of the active layer $\lambda$max. Therefore, assuming that the absorption coefficient with respect to the lasing wavelength $\lambda$e of the DFB laser is $\alpha$e and the absorption coefficient with respect to the bandgap wavelength of the active layer, or the peak wavelength $\lambda$max of the optical gain distribution of the active layer, is $\alpha$max, then $\alpha$e is approximately equal to $\alpha$max which is approximately equal to zero. This means that the absorption curve 903 affects neither $\lambda$max nor $\lambda$e, and the peak wavelength $\lambda$max of the optical gain distribution of the active layer is not suppressed with respect to the lasing wavelength $\lambda$e.

More specifically, there is a problem with the refractive index coupled laser in that a side mode suppression ratio (SMSR) of adequate magnitude cannot be secured between the lasing mode at the designed lasing wavelength $\lambda$e of the DFB laser and the mode around the peak wavelength $\lambda$max of the optical gain distribution of the active layer. In addition, because neither the $\lambda$max nor the $\lambda$e wavelengths are affected by the absorption curve 903, wide detuning cannot be accomplished using the refractive index coupled semiconductor laser of FIG. 9a. That is, the absolute value of the detuning amount $|\lambda e-\lambda max|$ cannot be made greater since an increase in the absolute value of the detuning amount $|\lambda e-\lambda max|$ would result in a large gain difference between the lasing wavelength $\lambda$e and $\lambda$max, and lowers the single mode properties and narrows the temperature range operation of the refractive index coupled semiconductor laser.

Finally, with the refractive index coupled DFB laser of FIG. 9a, the difference in the refractive index of the grating material 805 and the refractive index of the InP buried layer 807 is relatively small. Therefore, the physical distance between the grating material 805 and the active layer 801 of the DFB laser 800 must be reduced and, as a result, the coupling coefficient varies greatly depending on the thickness of the diffraction grating layer and the duty ratio which is expressed as W/Λ, where W is the width of one element of the diffraction grating and Λ is the pitch of the gratings. This makes it difficult to fabricate refractive index coupled DFB laser devices having the same characteristics resulting in low manufacturing yields for this type of laser.

As seen in FIG. 9b, the gain coupled DFB laser has a lasing wavelength $\lambda$e of which is less than the bandgap wavelength $\lambda$g of the diffraction grating layer. Specifically, the DFB laser of FIG. 9b has a lasing wavelength $\lambda$e of 1550 nm, a bandgap wavelength $\lambda$g of 1650 nm, and satisfies the relationship:

$$\lambda e < \lambda g.$$

Thus, this exemplary DFB laser reflects $\lambda e-\lambda g=-100$ nm. in the gain coupled DFB laser of FIG. 9b, there is a relatively large difference between the refractive index of the grating material 805 and refractive index of the InP buried layer 807 which makes it possible to increase the distance between the grating material 805 and the active layer 801. As a result, unlike the refractive index coupled DFB laser, the coupling coefficient of the gain coupled laser is hard to vary with the thickness of the diffraction grating layer and the duty ratio, and same-characteristic DFB lasers can be fabricated with stability thereby allowing higher production yields for this type of laser.

However, as also seen in FIG. 9b, the gain coupled DFB laser has an absorption loss curve 903' that crosses the lasing wavelength $\lambda$e and, therefore, absorption loss at the desired lasing wavelength $\lambda$e is large resulting in a high threshold current and unfavorable optical output-injection current characteristics. Moreover, although the absorption loss curve 903' also crosses the undesired wavelength of $\lambda$max, the absorption coefficient $\alpha$max is approximately equal to the absorption coefficient $\alpha$e. That is, as with the refractive index coupled DFB laser, the absorption curve 903' of the gain coupled DFB laser affects $\lambda$max and $\lambda$e equally and the peak wavelength $\lambda$max of the optical gain distribution of the active layer is not suppressed with respect to the lasing wavelength $\lambda$e resulting in a low side mode suppression ratio (SMSR). For example, in the conventional DFB lasers of FIGS. 9a and 9b, the SMSR, though depending on the amount of detuning to the lasing wavelength of the DFB laser, falls within a comparatively small range of 35 and 40 dB. Also like the refractive index coupled DFB laser, since the absorption curve 903' affects $\lambda$max and $\lambda$e equally, wide detuning cannot be accomplished because the wider the spacing between the $\lambda$max and $\lambda$e wavelengths, the smaller the gain of the desired lasing wavelength $\lambda$e will be with respect to the undesired $\lambda$max. Thus, whether the $\lambda$e is set shorter or longer than $\lambda$max, the absolute value of the detuning amount $|\lambda e-\lambda max|$ of conventional refractive index and gain coupled DFB lasers is limited several tens of nanometers thereby causing unfavorable single mode and temperature range characteristics for these devices.

U.S. patent application Ser. No. 09/906,842, the entire contents of which is incorporated herein by reference, discloses a DFB laser device having a selective absorption characteristic that enhances single longitudinal mode operation of a DFB semiconductor laser device over a relatively wider detuning range. The present inventors have recognized, however, that the ever increasing need for greater power from a DFB laser will require a demand for longer cavity length DFB lasers. The present inventors have also discovered that increasing the cavity length to increase the output power of the laser will generally diminish the overall operational characteristics of the DFB laser.

SUMMARY OF THE INVENTION

Accordingly, one object of the present invention is to provide a semiconductor laser device and method which overcomes the above described problems.

Another object of the present invention is to provide a DFB laser device having an increased cavity length for providing higher power, and also having good overall operational characteristics.

Another object of the present invention is to provide a semiconductor laser device having high optical output power, narrow spectral linewidth, and excellent single-longitudinal mode lasing characteristics, and which is capable of being manufactured at high product yield.

According to a first aspect of the invention, a semiconductor laser device and method for providing a light source are provided. The device on which the method is based includes a resonant cavity with a cavity length, an active layer structure provided within the resonant cavity and configured to radiate light in an optical gain distribution having a peak wavelength, an embedding layer provided within the resonant cavity and having a refractive index, and a diffraction grating embedded within the embedding layer and having a bandgap wavelength and a refractive index, the diffraction grating configured to select an emission wavelength of the resonant cavity independently of the peak wavelength in the optical gain distribution of the active layer structure. The embedding layer and diffraction grating are configured to provide operational characteristics satisfying the relationship $0<\lambda e-\lambda g \leq 100$ nm, where $\lambda e$ is the emission wavelength of the resonant cavity $\lambda g$ is the bandgap wavelength of the diffraction grating. In addition, a difference in the refractive index of the diffraction grating and the embedding layer satisfies the relationship $0.29<n1-n2$, where n1 is the refractive index of the diffraction grating and n2 is the refractive index of the embedding layer.

The embedding layer and diffraction grating may be configured to provide operational characteristics satisfying the relationship $0.8<\kappa L<2.0$, where $\kappa$ is a coupling coefficient of the diffraction grating and L is the length of the cavity. Alternatively, operational characteristics satisfying the relationship $1.2 \leq \kappa L<2.0$; $1.0 \leq \kappa L<2.0$; or $0.8<\kappa L<1.2$ may be provided. Moreover, the cavity length may be at least 300 $\mu$m and the laser device may include an active layer structure having a strain-compensated quantum well structure. In one embodiment, the strain-compensated quantum well structure includes six quantum well layers each having a thickness of about 5 nm, and six barrier layers associated with the quantum well layers and each having a thickness of about 10 nm. Each of the quantum well layers has a compression strain approximately within the range of 0.8%–1.2%, preferably 1.0%, and each of the barrier layers has a tensile strain approximately within the range of 0.1%–0.4%, preferably 0.1%.

The DFB laser has a coupling coefficient with a variance of less than $\pm 10$ cm$^{-1}$, preferably approximately $\pm 3$ cm$^{-1}$. Moreover, the active layer of the DFB laser is preferably configured to provide the following operational characteristics: $-20$ nm$<\lambda e-\lambda max<0$ nm, where $\lambda max$ is the peak wavelength in the optical gain distribution of the active layer. Alternatively, the operational characteristics: $-20$ nm$<\lambda e-\lambda max<-10$ nm, may be provided.

In another aspect of the invention, a laser module having a semiconductor laser device coupled to an optical fiber is provided. The semiconductor laser device includes a resonant cavity with a cavity length, an active layer structure provided within the resonant cavity and configured to radiate light in an optical gain distribution having a peak wavelength, an embedding layer provided within the resonant cavity and having a refractive index, and a diffraction grating embedded within the embedding layer and having a bandgap wavelength and a refractive index, the diffraction grating configured to select an emission wavelength of the resonant cavity independently of the peak wavelength in the optical gain distribution of the active layer structure. The embedding layer and diffraction grating are configured to provide operational characteristics satisfying the relationship $0<\lambda e-\lambda g \leq 100$ nm, where $\lambda e$ is the emission wavelength of the resonant cavity $\lambda g$ is the bandgap wavelength of the diffraction grating. In addition, a difference in the refractive index of the diffraction grating and the embedding layer satisfies the relationship $0.29<n1-n2$, where n1 is the refractive index of the diffraction grating and n2 is the refractive index of the embedding layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

As noted above, higher output power is generally pursued by using a longer cavity length (L) of the DFB laser. This increased cavity length also results in a narrow spectral linewidth of the laser device, which is desirable for use as a signal source in optical communications. As noted above, however, the present inventors have discovered that increasing the cavity length of a DFB laser to increase the laser's output power will generally diminish the overall operating characteristics of the DFB laser. Specifically, a longer cavity length causes an increase in the variance of the DFB laser's coupling coefficient $\kappa$, which represents the intensity of distributed feedback from the diffraction grating of the laser. For example, in conventional DFB lasers, the coupling coefficient $\kappa$ generally varies in the range of $\pm 10$ cm$^{-1}$ due to manufacturing variation in the thickness(height), duty ratio, or composition(refractive index) of the grating layer.

The present inventors have recognized that this large variance causes a larger variance for the normalized coupling coefficient, $\kappa L$, which degrades the product yield of the DFB lasers having a single-longitudinal-mode lasing characteristic (hereinafter referred to as "single mode yield"). Moreover, the present inventors have also recognized that increasing the coupling coefficient $\kappa$ to compensate for the increased $\kappa$ variance may improve the single mode yield, but has the undesirable effect of reducing the emission efficiency, i.e. slope efficiency (SE) of the laser, and thus reduces the optical output power of the lasers.

Thus, the present inventors have realized that there is a design tradeoff between the coupling coefficient $\kappa$, and the cavity length L of the laser device that precludes high yield production of a DFB laser device having both improved single longitudinal mode operation and high power output at a narrow spectral linewidth. The present invention was made in recognition of this problem.

Figure 1:
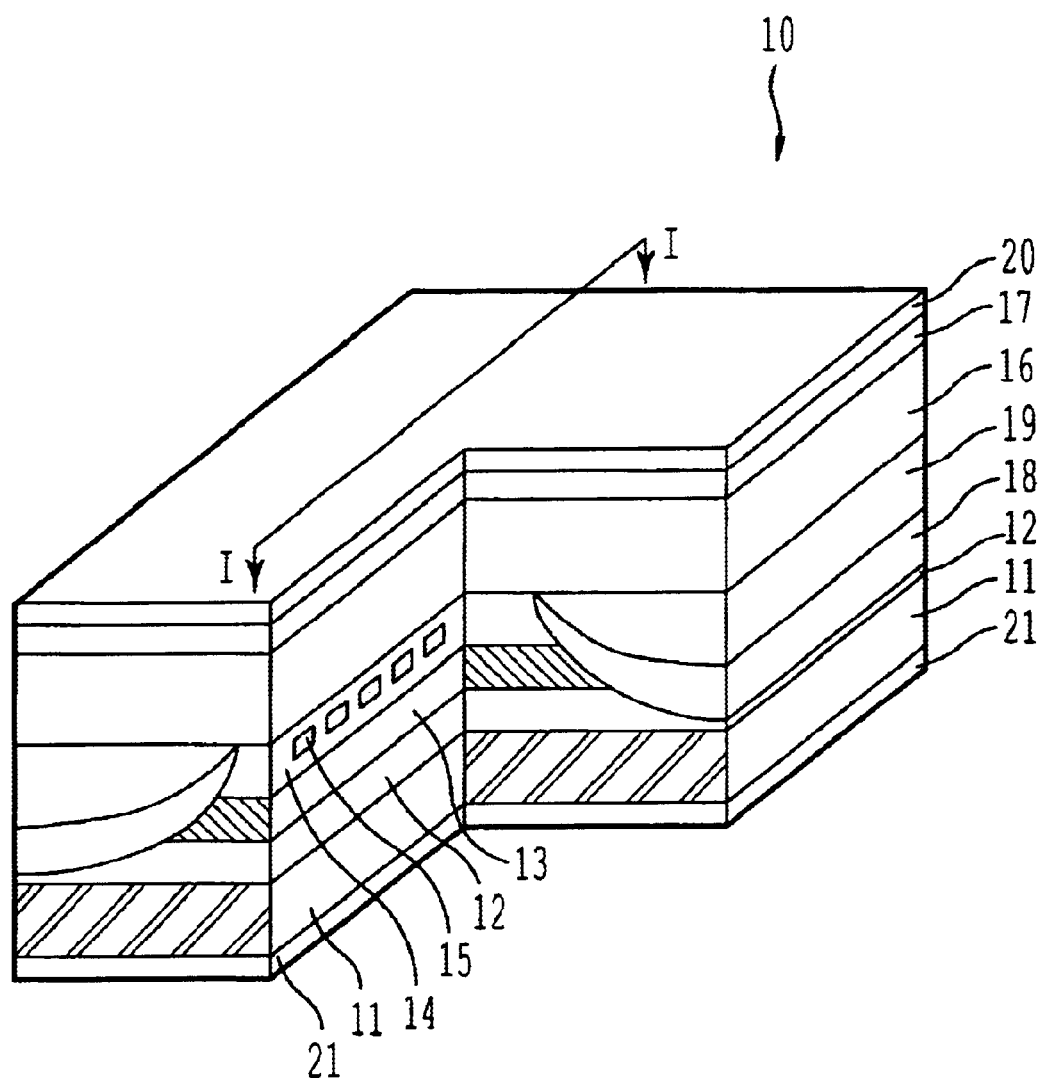
FIG. 1 is a partially sectional perspective view showing the structure of a semiconductor layer device according to a first embodiment of the present invention.
Figure 2:
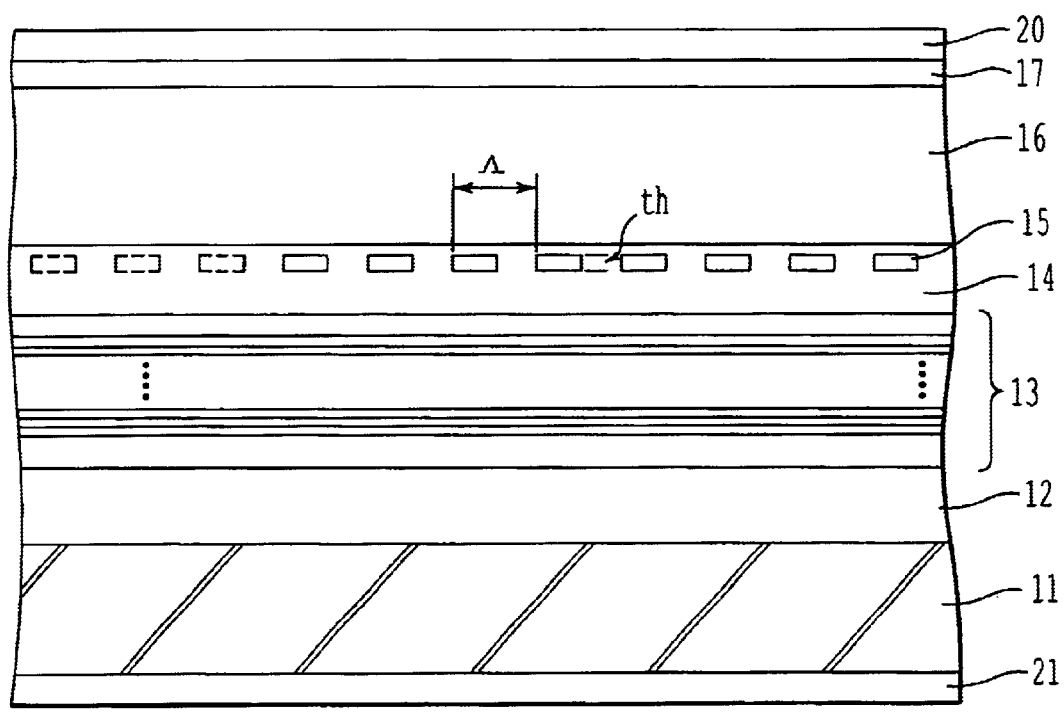
FIG. 2 is a sectional view of the semiconductor laser device taken along the arrowed line I—I of FIG. 1.

Referring now to the drawings wherein like elements are represented by the same or similar reference designations throughout, and more particularly to FIGS. 1 and 2, there is shown a semiconductor laser device 10 for providing high optical output power, narrow spectral linewidth, and excellent single-longitudinal mode lasing characteristics, and which is capable of being manufactured at a high product yield. FIG. 1 is a partially sectional perspective view showing the structure of a semiconductor- laser device according to the first embodiment of the present invention, and FIG. 2 is a sectional view of the semiconductor laser device taken along the arrowed line I—I of FIG. 1.

The semiconductor device of FIGS. 1 and 2 is a buried heterojunction type DFB laser device including an n-InP substrate 11 having a 1 μm-thick n-InP buffer layer 12, an active layer or active region 13, and a 200-nm-thick p-InP spacer layer 14 sequentially stacked on the substrate 11. Buffer layer 12 serves both as a buffer layer by the n-InP material and a under cladding layer, while the active layer 13 is a separate confinement multiple quantum well (SCH-MQW) structure having a 300 nm thickness. The MQW active layers 13 are implemented by a strain-compensated MQW structure including six QW layers and associated barrier layers. The QW layer has a compressive strain of 1.0% introduced therein, whereas the barrier layer has a tensile strain of 0.1% introduced therein for compensating the compressive strain of the QW layer.

As best seen in FIG. 2, a diffraction grating 15 of a GaInAsP material having a bandgap wavelength $\lambda g$ of about 1450 nm and a refractive index $n_1$ of about 3.46 is periodically formed within the p-InP spacer layer 14 substantially along the entire length of active layer 13. However, the diffraction grating 15 may be formed over a portion of the entire length of active layer 13 as shown by the phantom grating material in FIG. 2. The diffraction grating 15 of the embodiment of FIGS. 1 and 2 has a film thickness "th" of 20 nm, a period "Λ" of 240 nm, and selects a laser beam having a lasing wavelength $\lambda e$ of 1550 nm to be emitted by the semiconductor laser device 10. Thus, the lasing wavelength $\lambda e$ is approximately 100 nm greater than the bandgap wavelength $\lambda g$ of the grating material.

Moreover, the p-InP spacer layer 14 has a refractive index $n_2$ of 3.17, thereby achieving a difference in the refractive index between the spacer layer 14 and the diffraction grating 15 ($n_1-n_2$) of approximately 0.29.

A top portion of the n-InP buffer layer 12, the active layer 13, and the p-InP spacer layer 14 having the diffraction grating 15 buried therein form a laminated structure which is etched into mesa stripes so that the active layer 13 has a width of approximately 1.5 μm. Current block structures each including a p-InP layer 18 and an n-InP layer 19 are formed on both sides of the mesa stripes. The DFB laser device 10 also has a 2-μm-thick p-InP upper cladding layer 16 and a heavily doped p-GaInAs contact layer 17 sequentially stacked on the spacer layer 14 and blocking layers. Also included is a p-side electrode 20 made of a Ti/Pt/Au laminated metal film over the contact layer 17, and an n-side electrode 21 made of AuGeNi on the bottom surface of the substrate 11.

While not shown in the figures, the emission facet of the DFB laser 10 is coated with a non-reflection coat having a reflectance of about 1%, whereas the rear facet of the DFB laser is coated with a high-reflection coat having a reflectance of about 90%. Such a reflectance below about 3% at the emission facet suppresses a Fabry-Perot mode lasing at the peak wavelength in the optical gain distribution of the active layer, and in addition, the combination of this reflectance with a high reflectance above 80% at the rear facet affords an increase of the output efficiency at the emission facet.

It is to be understood that the device of FIGS. 1 and 2 is for exemplary purposes only as many variations of the structure of the laser device 10 will be readily apparent to one having ordinary skill in the art. For example, the material composition and layer thicknesses described may be changed without deviating from the principles of the present invention. Thus, the embodiment of FIGS. 1 and 2 are exemplary for a better understanding of the present invention and the present invention is not limited to these illustrations.

As noted above, the laser device of the first embodiment includes a diffraction grating having an emission wavelength $\lambda e$ that is about 100 nm longer than a bandgap wavelength $\lambda g$ of the grating material, and the grating material has a refractive index $n_1$ that is approximately 0.29 higher than a refractive index $n_2$ of the spacer layer 14. More generally, the first embodiment of the present invention is designed to meet the following characteristics:

$$0 < \lambda e - \lambda g \leq 100 \text{ nm; and}$$

$$n_1 - n_2 > 0.29.$$

The present inventors have discovered that a DFB laser device designed with these general characteristics provides the following improvements over conventional DFB lasers.

First, the DFB laser of the first embodiment has a lower optical loss for the emission wavelength $\lambda e$, due to the emission wavelength $\lambda e$ being longer than the bandgap wavelength $\lambda g$, thereby achieving a lower threshold current and an excellent optical output power characteristic with respect to the injection current. In addition, the large difference in the refractive index between the diffraction grating 15 and the embedding layer 14 provides a larger coupling coefficient even with the case of a large distance between the diffraction grating and the active layer. The larger coupling coefficient has a stable value due to less sensitivity to the variances in the thickness (height) and the duty ratio of the diffraction grating, and allows a large number of DFB lasers to have stable and uniform characteristics, thereby achieving a higher product yield. The coupling coefficient is approximately expressed as the following equation:

$$\kappa \alpha \Gamma_{grating} \times (n_1^2 - n_2^2) \times \sin(\pi w/\Lambda),$$

where $\Gamma_{grating}$ is confinement factor of the mode field into the grating layer. The present inventors have recognized that when the difference between n1 and n2 is large, $\Gamma_{grating}$ can be designed with small value to obtain a certain K value. The small $\Gamma_{grating}$ is realized by increasing the distance between the diffraction grating and active layer. With small $\Gamma_{grating}$, the factor of $\Gamma_{grating} \times \sin(\pi w/\Lambda)$ also becomes small, which indicates the variation of duty ratio makes smaller impact on the variation of κ.

More specifically, the difference in the refractive index above 0.29 in the DFB lasers suppresses the variance of the coupling coefficient κ down to±3 cm$^{-1}$, making it less sensitive to the variances in the thickness of the diffraction grating, the distance between the diffraction grating and the active layer and the duty ratio, which are generally associated with the fabrication process of the laser device. This allows manufacture of the DFB lasers having a designed coupling coefficient at a higher product yield. Accordingly, even for the case of a larger cavity length L, DFB lasers having a designed normalized coupling coefficient κL can be manufactured with a stable characteristics, such as having an excellent single-longitudinal-mode and a narrow spectral linewidth.

In order to further evaluate the DFB laser device 10, the present inventors tested nine DFB laser types having different cavity lengths L and coupling coefficients κ. Specifically, the cavity lengths of the devices were varied among 300, 400 and 500 μm, and the coupling coefficients were varied among 20, 30 and 40 cm$^{-1}$ for each of these cavity lengths. These coupling coefficients κ were obtained by controlling the thickness of the diffraction grating layers 15. Samples of each of the nine sample DFB lasers were subjected to measurements with respect to the maximum value ($SE_{max}$) in the slope efficiency distribution, the minimum value ($SE_{min}$) in the slope efficiency distribution, the single mode yield ($SM_{yield}$ (%)), and another product yield called herein spectral linewidth yield ($LW_{yield}$ (%)). Each of the samples tested met the characteristics of 0<λe−λg≦100 nm and $n_1-n_2 \leq 0.29$. In addition, each of the devices tested had a cavity length L of 300 μm or above to achieve the preferred power output. The results of these measurements are summarized in Table 1.

Based on the above data, the present inventors determined that a κL value of greater than 0.8 will achieve a higher $SM_{yield}$; however, an excessively higher κL value will reduce the $SE_{max}$. In addition, for a suitable $LW_{yield}$, the κL value should be 1.0 or above, wherein L should be larger for a fixed κ value. Accordingly, suitable values for all of the $SE_{max}$, single mode yield $SM_{yield}$ and linewidth yield $LW_{yield}$ may be achieved by considering the κL value for a DFB laser device. The selected κL value depends on whether the priority in the design for the DFB laser resides on the $SE_{max}$, single mode yield or linewidth yield.

For example, if the target design requires an $SE_{max}$>0.35 and a $SM_{yield}$>50%, then the κL value should satisfy the following relationship:

0.8<κL<2.0.

It is noted in this case, however, that a κL value below 1.0 involves a lower linewidth yield. This factor may be taken

TABLE 1

| Sample No | | 1 | 2 | 3 | 4 | 5 | 6 | 7 | 8 | 9 |
|---|---|---|---|---|---|---|---|---|---|---|
| κ | cm$^{-1}$ | 20 | 30 | 40 | 20 | 30 | 40 | 20 | 30 | 40 |
| L | μm | 300 | 300 | 300 | 400 | 400 | 400 | 500 | 500 | 500 |
| κL | | 0.6 | 0.9 | 1.2 | 0.8 | 1.2 | 1.6 | 1.0 | 1.5 | 2.0 |
| $SE_{max}$ | W/A | 0.49 | 0.47 | 0.45 | 0.45 | 0.42 | 0.4 | 0.4 | 0.37 | 0.35 |
| $SE_{min}$ | % | 0.33 | 0.3 | 0.28 | 0.32 | 0.29 | 0.26 | 0.2 | 0.17 | 0.14 |
| $SM_{yield}$ | % | 30 | 55 | 68 | 58 | 70 | 77 | 76 | 70 | 70 |
| $LW_{yield}$ | % | 0 | 25 | 43 | 13 | 73 | 90 | 73 | 82 | 100 |

As seen in Table 1, this table includes the a parameter κL, which is the product of the coupling coefficient κ and the length L. The parameter κL is used to evaluate the recorded data as shown in FIGS. 3–6.

Figure 3:
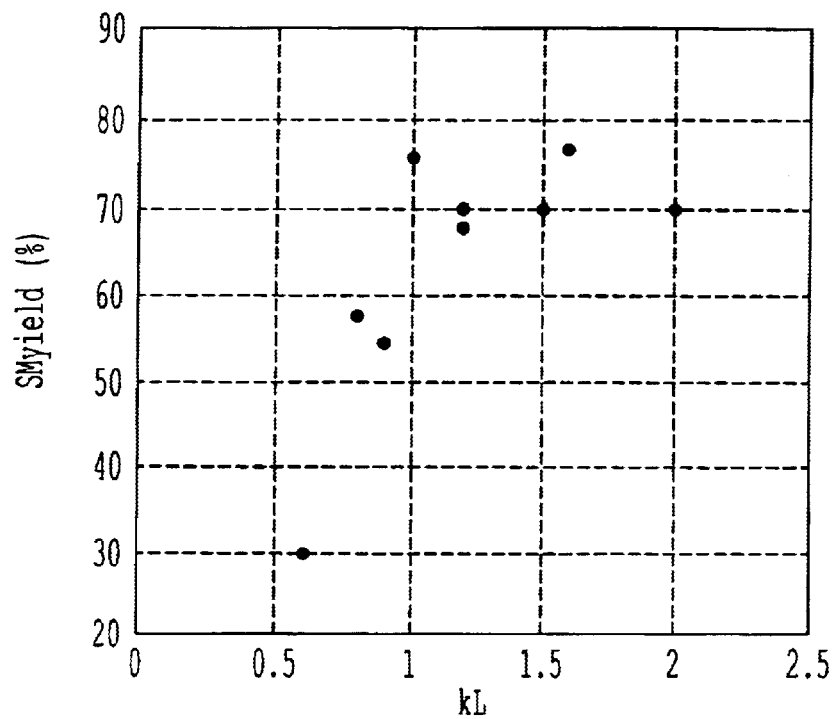
FIG. 3 shows the SM yield plotted as a function of the $\kappa L$ values for sample devices manufactured in accordance with the present invention.

FIG. 3 shows the SM yield plotted as a function of the κL values for sample devices manufactured in accordance with the present invention. The $SM_{yield}$ for each of the sample types was determined based on the criteria that a sample having a side mode suppression ratio (SMSR) above 35 dB is passed as a non-defective product, and a device testing 35 dB or below is a defective product. As seen in FIG. 3, a κL value above 0.8 abruptly raises the $SM_{yield}$ compared to a lower κL value below 0.8. Moreover, a κL value above 1.0 does not afford a significant improvement to $SM_{yield}$; that is, the κL above 1.0 does not achieve a $SM_{yield}$ significantly above 70%.

Figure 4:
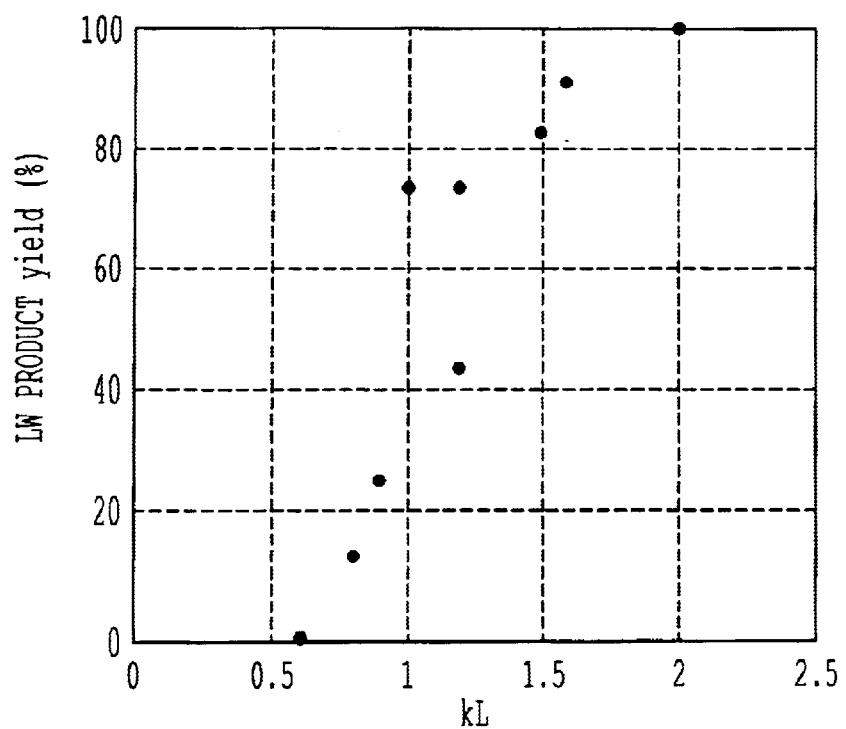
FIG. 4 shows LW$_{yield}$ plotted as a function of the $\kappa L$ values for the sample devices manufactured in accordance with the present invention.

FIG. 4 shows $LW_{yield}$ plotted as a function of the κL values for the sample devices manufactured in accordance with the present invention. The $LW_{yield}$ for each of the sample types was determined based on the criteria that a sample having a spectral linewidth below 2 MHz is passed as a non-defective product and a device testing 2 MHz or more is a defective product. As seen in this figure, a κL value in the range between 0.6 and 2.0 monotonically raises the $LW_{yield}$. Moreover, a κL value at about 1.0 in the range abruptly raises the $LW_{yield}$ up to 70%.

Figure 5:
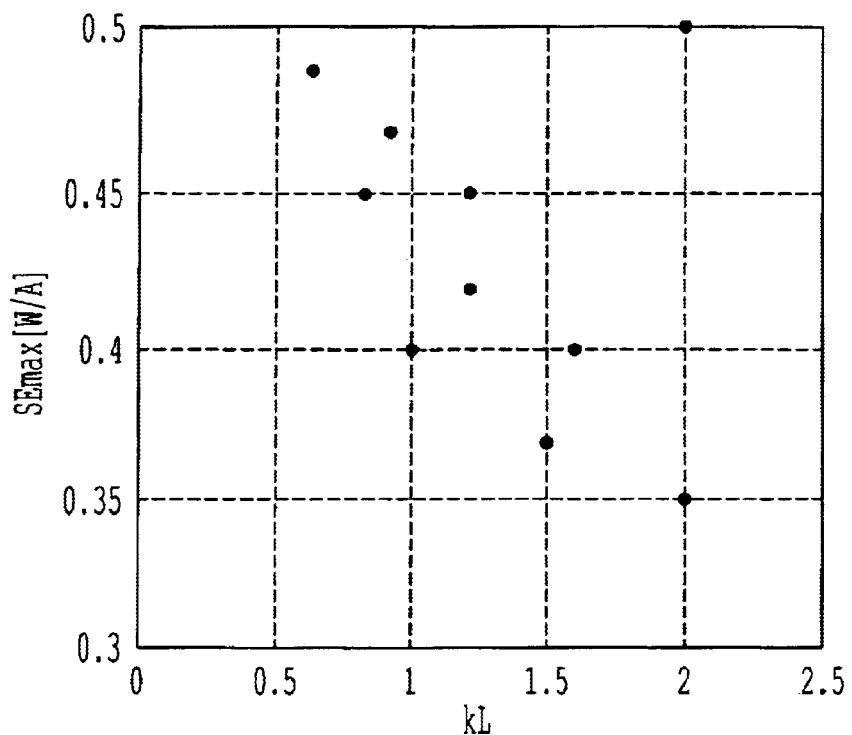
FIG. 5 shows SE$_{max}$ plotted as a function of the $\kappa L$ values for sample devices manufactured in accordance with the present invention.

FIG. 5 shows $SE_{max}$ plotted as a function of the κL values for sample devices manufactured in accordance with the present invention. As seen in this figure, a lower κL value affords a higher $SE_{max}$, and it is preferable that the κ value be as low as around 20 cm$^{-1}$ and the cavity length L be smaller for a higher $SE_{max}$.

Figure 6:
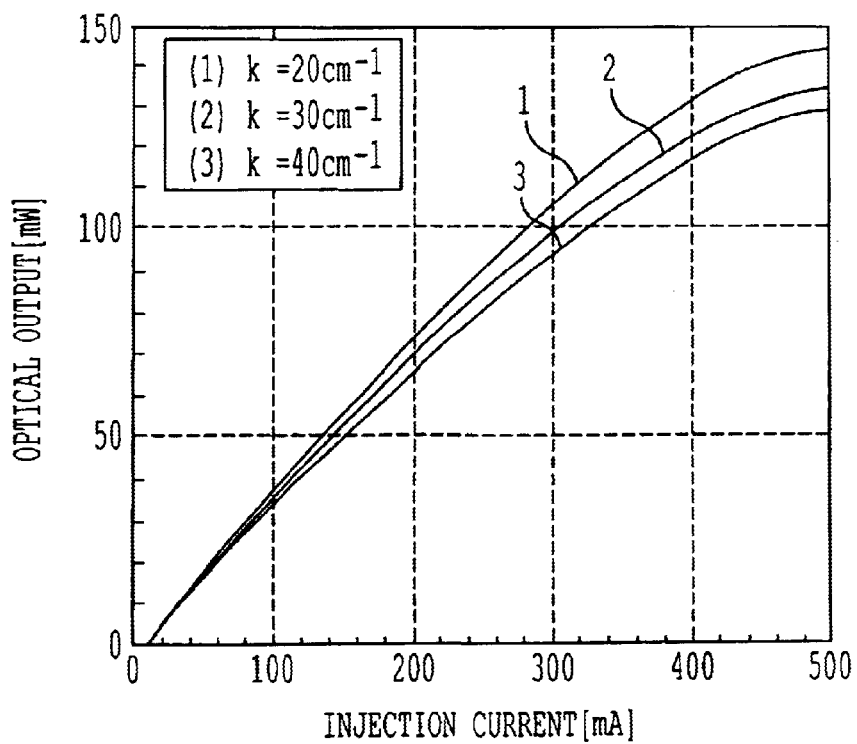
FIG. 6 shows the optical output power characteristics of the samples manufactured in accordance with the present invention, wherein the optical output power (mW) is plotted against the injection current (mA)

Finally, FIG. 6 shows the optical output power characteristics of the samples manufactured in accordance with the present invention, wherein the optical output power (mW) is plotted against the injection current (mA). As seen in FIG. 6, output power was plotted for devices having each of the κ values tested. FIG. 6 makes clear that a smaller κ affords a higher slope efficiency to the DFB laser.

into account if linewidth is important to the laser device. As another example, if the above target design also requires an $LW_{yield} \leq 50\%$, then the κL value should satisfy the following relationship:

1.0≦κL<2.0.

Alternatively, if a higher efficiency, $SE_{max}$>0.4 W/A, has a priority over the single mode yield and the linewidth yield, the κL value should satisfy the following relationship:

0.8<κL<1.2.

However, as a final example, if the single mode yield and the linewidth yield have priority over the slope efficiency, then the κL value should satisfy the following relationship:

1.2≦κL<2.0.

Figure 7:
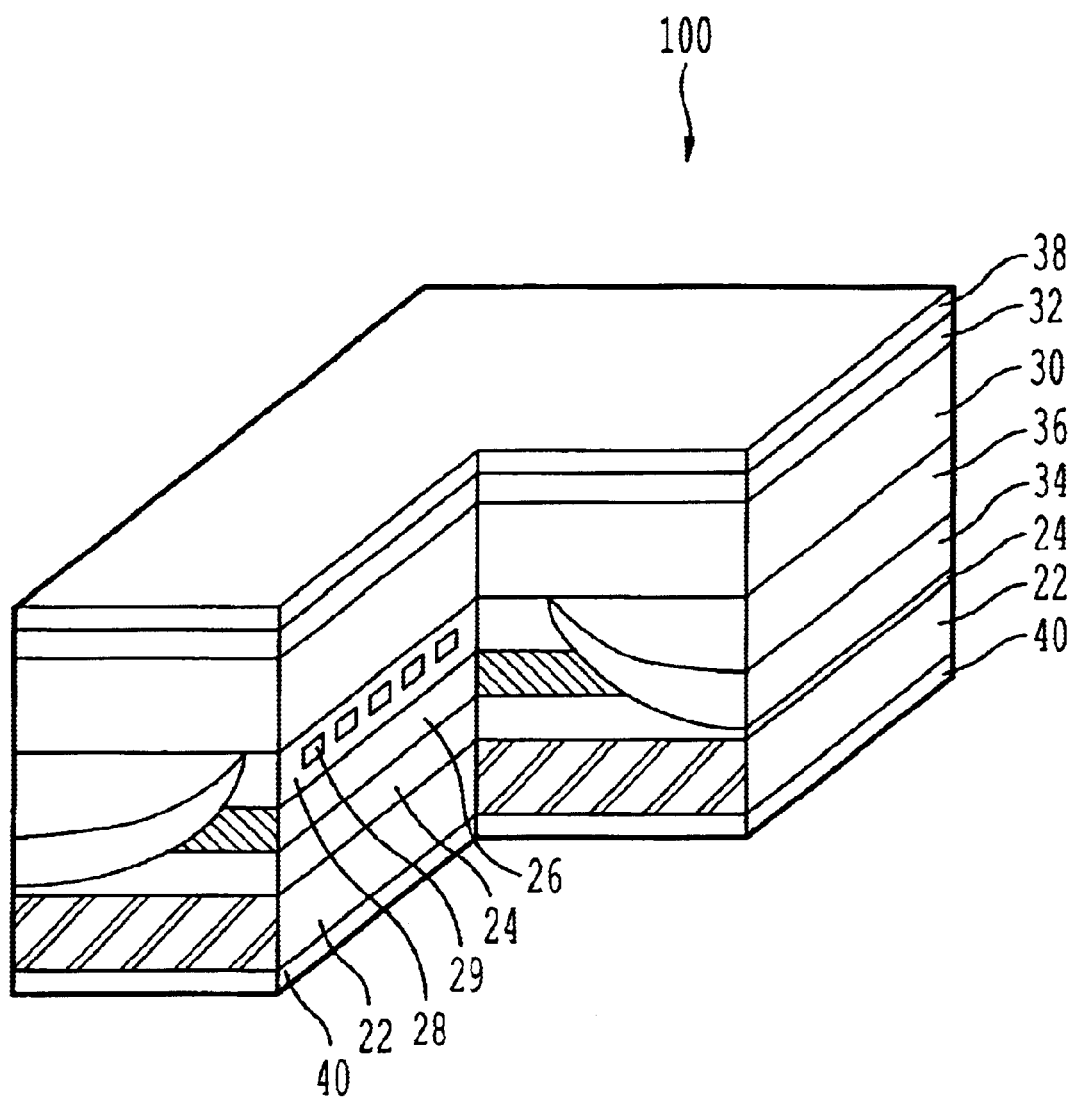
FIG. 7 is a partially sectional perspective view showing the structure of a semiconductor laser device according to an embodiment of the present invention.
Figure 8:
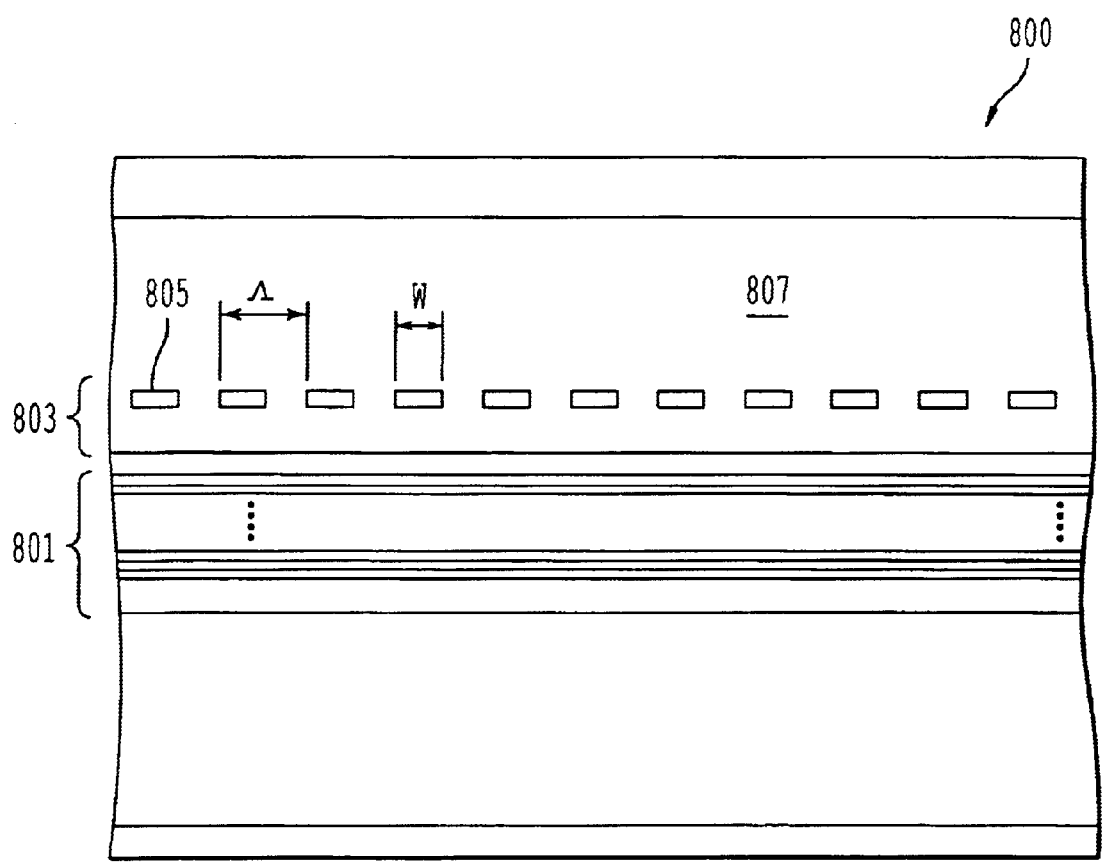
FIG. 8 is a cross section view of a conventional DFB laser device.
Figure 9A:
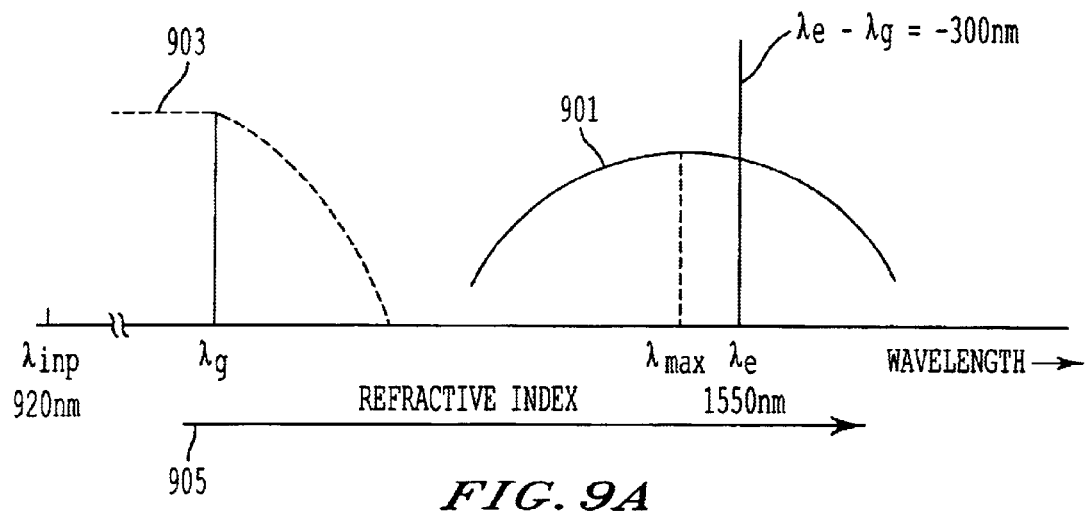
FIGS. 9a and 9b are wavelength graphs showing the operational characteristics of conventional refractive index coupled and gain coupled DFB lasers.
Figure 9B:
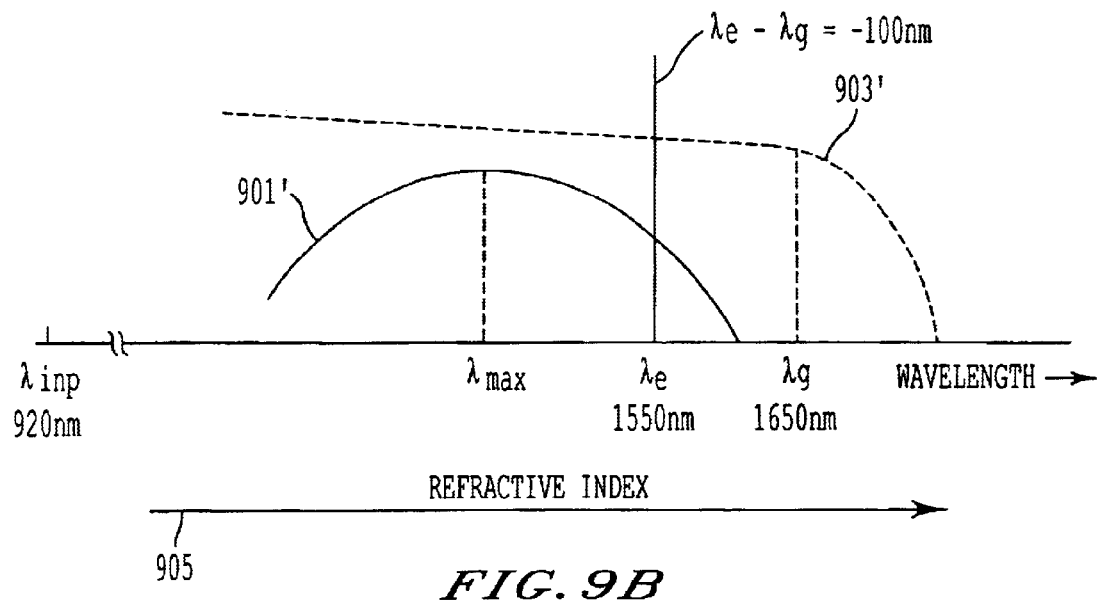

FIG. 7 shows a semiconductor laser device 100 for providing high optical output power, narrow spectral linewidth, and excellent single-longitudinal mode lasing characteristics, and which is capable of being manufactured at high product yield, according to another embodiment of the present invention. As with the first embodiment shown in FIG. 1, the semiconductor device of FIG. 7 is a buried hetero-junction type DFB laser device including an n-InP substrate 22 having a 1-μm-thick n-InP buffer layer 24, an active layer or active region 26, and a 200-nm-thick p-InP spacer layer 28 sequentially stacked on the substrate 22. Buffer layer 24 serves both as a buffer layer by the n-InP material and a under cladding layer, while the active layer 26 is a separate confinement multiple quantum well (SCH-MQW) structure having a 300 nm thickness.

The MQW active layers 26 are implemented by a strain-compensated MQW structure including six QW layers and associated barrier layers. The QW layer has a compressive strain of 1.0% introduced therein, whereas the barrier layer has a tensile strain of 0.1% introduced therein for compensating the compressive strain of the QW layer. The strain-compensated MQW structure affords a higher optical gain to the active layers, thereby reducing the threshold current and increasing the slope efficiency of the DFB laser. In addition, the strain-compensated structure improves the long-term reliability of the laser device. The optimum strains in the QW layers and the barrier layers depend on the thicknesses of the respective layers and the number of QW layers in the MQW structure. For example, where the QW layers have a thickness of 5 nm, the barrier layers have a thickness of 10 nm, and the number of QW layers is six, the preferable compressive strain in the QW layers is around 0.8% to 1.2% whereas the preferable tensile strain in the barrier layers is around 0.1% to 0.4%.

A diffraction grating 29 of a GaInAsP material having a bandgap wavelength kg of about 1500 nm and a refractive index of about 3.49 is periodically formed within the p-InP spacer layer 28 substantially along the entire length of active layer 26. In the embodiment of FIG. 7, the active layer has a length, i.e., cavity length L, of 400 μm. The diffraction grating of the embodiment of FIG. 7 has a film thickness "th" of 20 nm, a period "Λ" of 240 nm, and selects a laser beam having a lasing λe wavelength of 1550 nm to be emitted by the semiconductor laser device 100. Thus, the lasing wavelength is approximately 50 nm greater than the bandgap wavelength λg of the grating material. Moreover, the p-InP spacer layer 28, embedding therein the diffraction grating 29, has a refractive index of 3.17, thereby achieving a difference of 0.32 in the refractive index between the embedding layer 28 and the diffraction grating 29. Finally, the grating structure of FIG. 7 provides a coupling coefficient of 40 cm$^{-1}$, thereby providing a κL parameter of 1.6.

The MQW active layers 26 has a peak wavelength $\lambda_{max}$ in the optical gain distribution at 1560 nm, thereby achieving a detuning amount ($\lambda$e- $\lambda_{max}$) at -10 nm. The present inventors selected a detuning amount of -10 nm based on the recognition that the spectral linewidth in the output laser abruptly increases if the detuning amount exceeds around +10 nm and a detuning amount below +10 nm affords a narrow spectral linewidth. Moreover, the present inventors recognized that a detuning amount equal to or below -10 nm affords an excellent high-speed modulation. In consideration of the requirements for a narrow spectral linewidth, for a suitable wavelength distribution of the optical gain of the active layers and for the stableness in manufacture of the laser devices, the detuning amount should reside around -20 nm to 10 nm. On the other hand, in consideration of the requirement for the high-speed modulation, the detuning amount should reside around -20 nm to -10 nm.

A top portion of the n-InP buffer layer 24, the active layer 26, and the p-InP spacer layer 28 having the diffraction grating 29 buried therein form a laminated structure which is etched into mesa stripes so that the active layer 26 has a width of approximately 1.5μm. Current block structures each including a p-InP layer 34 and an n-InP layer 36 are formed on both sides of the mesa stripes. The DFB laser device 100 also has a 2-μm-thick p-InP upper cladding layer 30 and a heavily doped p-GaInAs contact layer 32 sequentially stacked on the spacer layer 28 and blocking layers. Also included is a p-side electrode 38 made of a Ti/Pt/Au laminated metal film over the contact layer 32, and an n-side electrode 40 made of AuGeNi on the bottom surface of the substrate 22.

The present inventors have confirmed that the DFB laser of the embodiment of FIG. 7 has an optical output power as high as 100 mW or more due to the large cavity length selected at 400 μm, and also has a suitable single-longitudinal-mode lasing characteristic including a spectral linewidth as narrow as 2 MHz or less due to the specified κL value selected at 1.6. Moreover, the present inventors discovered that the DFB lasers having these specified characteristics can be manufactured with a single mode yield as high as 77% and a linewidth yield as high as 90%. The large difference in the refractive index between the diffraction grating 29 and the embedding p-InP spacer layer 28 affords a high coupling coefficient even in the case of a larger thickness of the p-InP spacer layer 28 which generally involves a larger distance between the diffraction grating and the active layers. The large coupling coefficient inevitably results in a stable coupling coefficient having a smaller variance due to less sensitivity to variances in the thickness and the duty ratio of the diffraction grating, whereby DFB lasers having stable characteristics can be manufactured at a higher product yield due to a larger tolerance of the process conditions for the epitaxial growth etc.

Obviously, numerous modifications and variations of the present invention are possible in light of the above teachings. It is therefore to be understood that within the scope of the appended claims, the invention may be practiced otherwise than as specifically described herein.

What is claimed is:

1. A distributed feedback (DFB) semiconductor laser device comprising:
    first and second cladding layers forming at least a portion of a resonant cavity having a cavity length;
    an active layer region provided between said first and second cladding layers and within said resonant cavity, the active layer region being configured to radiate light in an optical gain distribution having a peak wavelength;
    an embedding layer also provided between said first and second cladding layers and within said resonant cavity, the embedding layer having a refractive index; and
    a diffraction grating embedded within said embedding layer and having a bandgap wavelength and a refractive index, said diffraction grating configured to select an emission wavelength of said resonant cavity independently of the peak wavelength in the optical gain distribution of said active layer region, wherein
    said embedding layer and diffraction grating are configured to provide operational characteristics satisfying the relationship 0<λe−λg≦100 nm, where λe is the emission wavelength of said resonant cavity λg is the bandgap wavelength of said diffraction grating, and
    a difference in the refractive index of said diffraction grating and said embedding layer satisfies the relationship 0.29<n1−n2, where n1 is the refractive index of the diffraction grating and n2 is the refractive index of the embedding layer.

2. The laser device of claim 1, said embedding layer and diffraction grating are further configured to provide operational characteristics satisfying the relationship 0.8<κL <2.0, where κ is a coupling coefficient of the diffraction grating and L is the length of the cavity.

3. The laser device of claim 2, wherein said embedding layer and diffraction grating are configured to provide operational characteristics satisfying the relationship 1.2<κL<2.0.

4. The laser device of claim 2, wherein said embedding layer and diffraction grating are configured to provide operational characteristics satisfying the relationship 1.0<κL<2.0.

5. The laser device of claim 4, wherein said active layer region comprises a strain-compensated quantum well structure.

6. The laser device of claim 2, wherein said embedding layer and diffraction grating are configured to provide operational characteristics satisfying the relationship $0.8 < \kappa L < 1.2$.

7. The laser device of claim 6, wherein said active layer region comprises a strain-compensated quantum well structure.

8. The laser device of claim 1, wherein said cavity length is at least 300 $\mu$m.

9. The DFB laser of claim 2, wherein said active layer region comprises a strain-compensated quantum well structure comprising:

six quantum well layers each having a thickness of about 5 nm; and six barrier layers associated with said quantum well layers and each having a thickness of about 10 nm.

10. The DFB laser of claim 9, wherein each of said quantum well layers has a compression strain approximately within the range of 0.8%–1.2%, and each of the barrier layers has a tensile strain approximately within the range of 0.1%–0.4%.

11. The DFB laser of claim 10, wherein each of said quantum well layers has a compression strain of approximately 1.0%, and each of the barrier layers has a tensile strain of approximately 0.1%.

12. The DFB laser of claim 1, wherein a coupling coefficient of said laser has a variance of less than 10 $cm^{-1}$.

13. The DFB laser of claim 12, wherein said variance is approximately $\pm 3$ $cm^{-1}$.

14. The DFB laser of claim 2, wherein the active layer region is configured to provide the following operational characteristics: $-20$ nm $< \lambda e - \lambda max < 0$ nm, where $\lambda max$ is the peak wavelength in the optical gain distribution of the active layer region.

15. The DFB laser of claim 2, wherein the active layer region is configured to provide the following operational characteristics: $-20$ nm $< \lambda e - \lambda max < -10$ nm, where $\kappa max$ is the peak wavelength in the optical gain distribution of the active layer region.

16. A method of providing light from a distributed feedback (DFB) semiconductor laser device comprising:

radiating light from an active layer region provided between first and second cladding layers and within a resonant cavity of the laser device, said light having an optical gain distribution with a peak wavelength;

selecting an emission wavelength of said resonant cavity independently of the peak wavelength in the optical gain distribution of said active layer region by providing a diffraction grating within an embedding layer also provided between first and second cladding layers of the laser device; and providing said embedding layer and diffraction grating such that a difference in the refractive index of said diffraction grating and said embedding layer satisfies the relationship $0.29 < n1 - n2$, where n1 is the refractive index of the diffraction grating and n2 is the refractive index of the embedding layer, wherein the operational characteristics of the laser device satisfy the relationship $0 < \lambda e - \lambda g \leq 100$ nm, where $\lambda e$ is the emission wavelength of said resonant cavity and $\kappa g$ is the bandgap wavelength of said diffraction grating.

17. The method of claim 16, wherein said providing said embedding layer and diffraction grating further comprises providing operational characteristics satisfying the relationship $0.8 < \kappa L < 2.0$, where $\kappa$ is a coupling coefficient of the diffraction grating and L is the length of the cavity.

18. The method of claim 17, wherein said providing said embedding layer and diffraction grating further comprises providing operational characteristics satisfying the relationship $1.2 \leq \kappa L < 2.0$.

19. The method of claim 17, wherein said providing said embedding layer and diffraction grating further comprises providing operational characteristics satisfying the relationship $1.0 \leq \kappa L < 2.0$.

20. The method of claim 17, wherein said providing said embedding layer and diffraction grating further comprises providing operational characteristics satisfying the relationship $0.8 < \kappa L < 1.2$.

21. The method of claim 16, wherein said providing said embedding layer and diffraction grating further comprises providing said embedding layer and diffraction such that a coupling coefficient of said laser device has a variance of less than $\pm 10$ $cm^{-1}$.

22. The method of claim 21, wherein said providing said embedding layer and diffraction grating further comprises providing said embedding layer and diffraction such that a coupling coefficient of said laser has a variance of $\pm 3$ $cm^{-1}$.

23. The method of claim 17, further comprising providing an active layer region having the following operational characteristics: $-20$ nm $< \lambda e - \lambda max < 0$ nm, where $\lambda max$ is the peak wavelength in the optical gain distribution of the active layer region.

24. The method of claim 17, further comprising providing an active layer region having the following operational characteristics: $-20$ nm $< \lambda e - \lambda max < -10$ nm, where $\lambda max$ is the peak wavelength in the optical gain distribution of the active layer region.

25. A distributed feedback (DFB) semiconductor laser device comprising:

means for radiating light within a resonant cavity of the laser device, said light having an optical gain distribution with a peak wavelength;

means for selecting an emission wavelength of said resonant cavity independently of the peak wavelength in the optical gain distribution of said light; and means for providing operational characteristics of the laser device to satisfy the relationship $0 < \lambda e - \lambda g \leq 100$ nm, where $\lambda e$ is the emission wavelength of said resonant cavity and $\lambda g$ is the bandgap wavelength of said diffraction grating.

26. The laser device of claim 25, further comprising means for providing operational characteristics satisfying the relationship $0.8 < \kappa L < 2.0$, where $\kappa$ is a coupling coefficient of the diffraction grating and L is the length of the cavity.

27. The laser device of claim 26, further comprising means for providing a coupling coefficient of said laser having a variance of less than $\pm 10$ $cm^{-1}$.

28. The laser device of claim 27, further comprising means for providing a coupling coefficient of said laser having a variance of less than $\pm 3$ $cm^{-1}$.

29. The laser device of claim 26, further comprising means for providing following operational characteristics: $-20$ nm $< \lambda e - \lambda max < 0$ nm, where $\lambda max$ is the peak wavelength in the optical gain distribution of the light.

30. The laser device of claim 26, further comprising means for providing the following operational characteristics: $-20$ nm $< \lambda e - \lambda max < -10$ nm, where $\lambda max$ is the peak wavelength in the optical gain distribution of the light.

31. A semiconductor laser module comprising:

a distributed feedback (DFB) semiconductor laser device comprising:

first and second cladding layers forming at least a portion of a resonant cavity having a cavity length;

an active layer region provided between said first and second cladding layers and within said resonant cavity, the active layer region being configured to radiate light in an optical gain distribution having a peak wavelength;

an embedding layer also provided between said first and second cladding layers and within said resonant cavity, the embedding layer having a refractive index; and a diffraction grating embedded within said embedding layer and having a bandgap wavelength and a refractive index, said diffraction grating configured to select an emission wavelength of said resonant cavity independently of the peak wavelength in the optical gain distribution of said active layer region, wherein said embedding layer and diffraction grating are configured to provide operational characteristics satisfying the relationship $0 < \lambda e - \lambda g \leq 100$ nm, where $\lambda e$ is the emission wavelength of said resonant cavity $\lambda g$ is the bandgap wavelength of said diffraction grating, and a difference in the refractive index of said diffraction grating and said embedding layer satisfies the relationship $0.29 < n1 - n2$, where n1 is the refractive index of the diffraction grating and n2 is the refractive index of the embedding layer; and an optical fiber coupled to said semiconductor laser device.

* * * * *